(12) United States Patent
Hwang et al.

(10) Patent No.: US 9,061,534 B2
(45) Date of Patent: Jun. 23, 2015

(54) DONOR SUBSTRATE, METHOD OF MANUFACTURING DONOR SUBSTRATE, AND METHOD OF MANUFACTURING ORGANIC LIGHT-EMITTING DISPLAY DEVICE

(71) Applicant: Samsung Display Co., Ltd., Yongin, Gyeonggi-Do (KR)

(72) Inventors: In-Hyun Hwang, Hwaseong-si (KR); Jin-Han Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 9 days.

(21) Appl. No.: 13/955,706

(22) Filed: Jul. 31, 2013

(65) Prior Publication Data
US 2014/0322842 A1    Oct. 30, 2014

(30) Foreign Application Priority Data
Apr. 29, 2013    (KR) .......................... 10-2013-0047600

(51) Int. Cl.
| | |
|---|---|
| *H01L 21/00* | (2006.01) |
| *B41M 5/382* | (2006.01) |
| *H01L 51/00* | (2006.01) |
| *H01L 27/32* | (2006.01) |

(52) U.S. Cl.
CPC ......... *B41M 5/38242* (2013.01); *H01L 51/009* (2013.01); *H01L 27/32* (2013.01)

(58) Field of Classification Search
None
See application file for complete search history.

(56) References Cited

U.S. PATENT DOCUMENTS

| | | | |
|---|---|---|---|
| 6,358,664 B1 * | 3/2002 | Nirmal et al. ................. | 430/200 |
| 2006/0188697 A1 * | 8/2006 | Lee ................................. | 428/156 |
| 2012/0231228 A1 * | 9/2012 | Fujimori et al. ............... | 428/172 |
| 2014/0332794 A1 * | 11/2014 | Birnstock et al. .............. | 257/40 |
| 2015/0034925 A1 * | 2/2015 | Shinotsuka et al. ............ | 257/40 |

FOREIGN PATENT DOCUMENTS

| | | |
|---|---|---|
| KR | 10-2007-0049003 A | 5/2007 |
| KR | 10-2010-0013448 A | 2/2010 |
| KR | 10-2012-0042022 A | 5/2012 |

\* cited by examiner

*Primary Examiner* — Charles Garber
*Assistant Examiner* — Evren Seven
(74) *Attorney, Agent, or Firm* — Christie, Parker & Hale LLP

(57) ABSTRACT

Aspects of the present invention are directed toward donor substrate, method of manufacturing donor substrate, and method of manufacturing organic light-emitting display device. According to an embodiment of the present invention, a donor substrate includes a base layer which includes an element region and an encapsulation region surrounding the element region; a transfer assist layer which is disposed on the base layer and includes a first uneven portion disposed on the encapsulation region; and a transfer layer which is disposed on the transfer assist layer. The first uneven portion is formed on a surface of the transfer assist layer which contacts the transfer layer.

6 Claims, 16 Drawing Sheets

710

DONOR SUBSTRATE, METHOD OF MANUFACTURING DONOR SUBSTRATE, AND METHOD OF MANUFACTURING ORGANIC LIGHT-EMITTING DISPLAY DEVICE

CROSS-REFERENCE TO RELATED APPLICATION

This application claims priority to and the benefit of Korean Patent Application No. 10-2013-0047600, filed on Apr. 29, 2013, in the Korean Intellectual Property Office, the entire content of which is incorporated herein by reference.

BACKGROUND

1. Field

The following description relates to a donor substrate, a method of manufacturing the donor substrate, and a method of manufacturing an organic light-emitting display device.

2. Description of the Related Art

An organic light-emitting display device (OLED) is a display device that can display information such as images, text, etc. by using light generated when holes and electrons supplied respectively from an anode and a cathode combine in an organic layer interposed between the anode and the cathode.

In order to form the organic layer, a comparable method of manufacturing an OLED uses processes, such as a printing process utilizing inkjet printing, spin coating, nozzle deposition, etc.; a process of depositing and then patterning a layer; or a transfer process utilizing heat or laser beams. Among these processes, a laser induced thermal imaging (LITI) process is capable of finely patterning an organic layer and is easy to perform.

In the LITI process, light emitted from a light source is absorbed by a transfer assist layer (e.g., a light-to-heat conversion layer) of a donor substrate and is converted into thermal energy. The thermal energy causes a transfer layer to be transferred onto an element substrate.

However, the transfer layer may not be easily separated from the donor substrate in the transfer process. Therefore, the transfer layer may not be transferred exactly to a desired region of the element substrate. Conversely, the transfer layer may be too easily separated from the donor substrate and thus be transferred even to an undesired region of the element substrate. That is, an "unwanted transfer" phenomenon may occur.

SUMMARY

Aspects of the present invention are directed toward a donor substrate which can prevent an "unwanted transfer" phenomenon in which a transfer layer is separated from the donor substrate and transferred to an undesired region of an element substrate.

Aspects of the present invention are also directed toward a method of manufacturing a donor substrate which can prevent an "unwanted transfer" phenomenon in which a transfer layer is separated from the donor substrate and transferred to an undesired region of an element substrate.

Aspects of the present invention are also directed toward a method of manufacturing an organic light-emitting display device (OLED) which can prevent an "unwanted transfer" phenomenon in which a transfer layer is separated from a donor substrate and transferred to an undesired region of an element substrate, and can prevent the occurrence of encapsulation defects of the OLED.

However, aspects of the present invention are not restricted to the ones set forth herein. The above and other aspects of the present invention will become more apparent to one of ordinary skill in the art to which the present invention pertains by referencing the detailed description of embodiments of the present invention given below.

According to an embodiment of the present invention, a donor substrate includes a base layer which includes an element region and an encapsulation region surrounding the element region, a transfer assist layer which is disposed on the base layer and includes a first uneven portion disposed on the encapsulation region, and a transfer layer which is disposed on the transfer assist layer, wherein the first uneven portion is formed on a surface of the transfer assist layer which contacts the transfer layer.

According to another embodiment of the present invention, a method of manufacturing a donor substrate includes forming a preliminary transfer assist layer on a base layer, converting the preliminary transfer assist layer into a transfer assist layer by selectively plasma-treating the preliminary transfer assist layer, and forming a transfer layer on the transfer assist layer.

According to still another embodiment of the present invention, a method of manufacturing an organic light-emitting display device includes providing an element substrate which includes a first electrode and a pixel defining layer exposing a plurality of regions of the first electrode, laminating a donor substrate and the element substrate such that a transfer layer of the donor substrate faces the first electrode of the element substrate, and forming an organic layer by transferring the transfer layer onto the first electrode of the element substrate by irradiating laser beams to an element region of the donor substrate, wherein the donor substrate includes a base layer which includes the element region and an encapsulation region surrounding the element region, a transfer assist layer which is disposed on the base layer and includes a first uneven portion disposed on the encapsulation region, and a transfer layer which is disposed on the transfer assist layer, wherein the first uneven portion is formed on a surface of the transfer assist layer which contacts the transfer layer.

BRIEF DESCRIPTION OF THE DRAWINGS

The above and other aspects and features of the present invention will become more apparent by describing in more detail some example embodiments thereof with reference to the attached drawings, in which.

DETAILED DESCRIPTION

Figure 1:
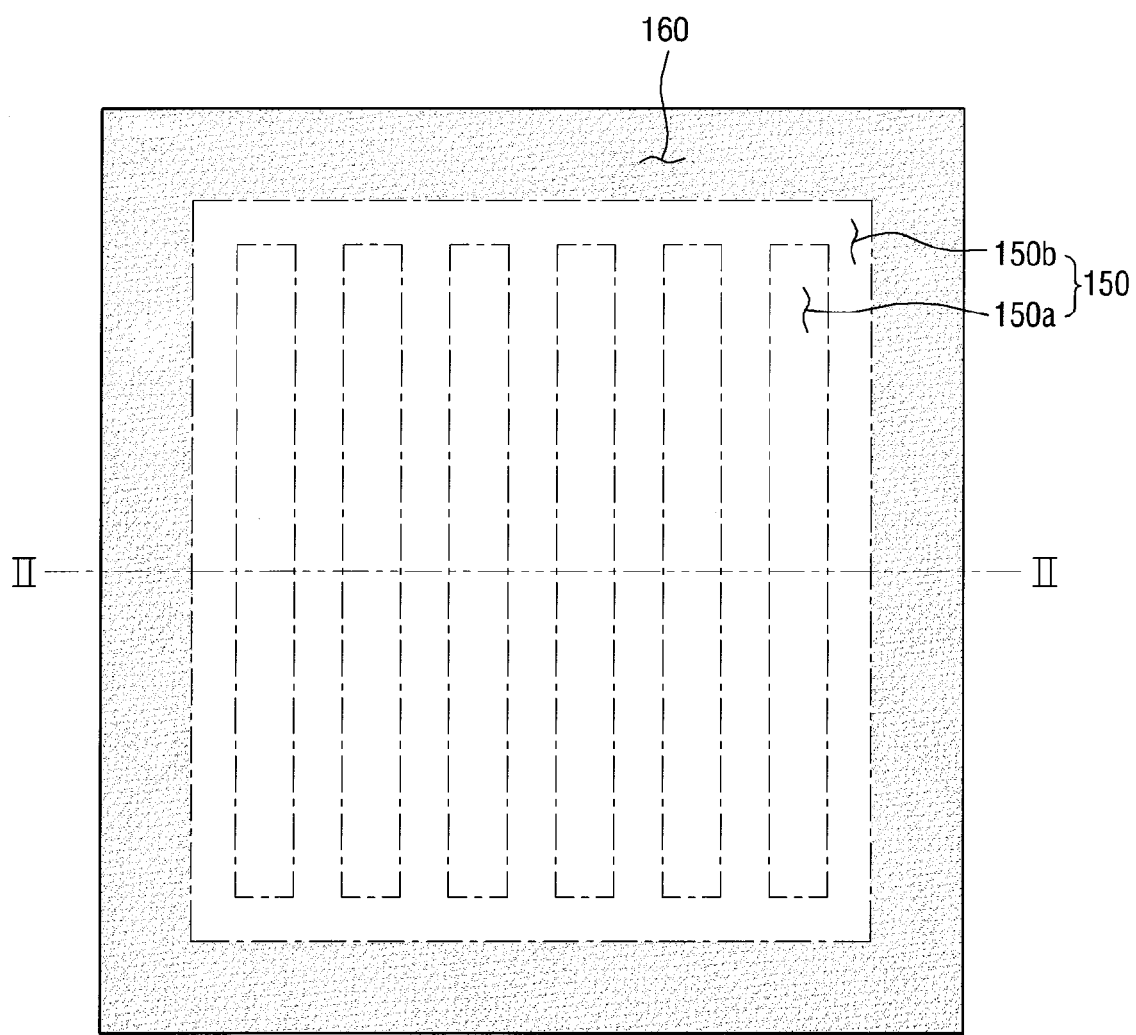
FIG. 1 is a plan view of a donor substrate according to an embodiment of the present invention.

Enhancements and features of the present invention and methods of accomplishing the same may be understood more readily by reference to the following detailed description of some embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims and equivalents thereof. Thus, in some embodiments, known structures and devices are not shown in order not to obscure the description of the invention with unnecessary details. Like numbers refer to like elements throughout. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items. Further, the use of "may" when describing embodiments of the present invention refers to "one or more embodiments of the present invention."

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the example views may be modified depending on manufacturing technologies and/or tolerances. Therefore, the embodiments of the invention are not limited to those shown in the views, but include modifications in configuration formed on the basis of manufacturing processes. Therefore, regions shown in the figures are for schematic illustrations only, and shapes of regions shown in the figures represent specific shapes of regions of elements only and do not limit aspects (scopes) of the invention.

Hereinafter, embodiments of the present invention will be described with reference to the attached drawings.

Figure 2:
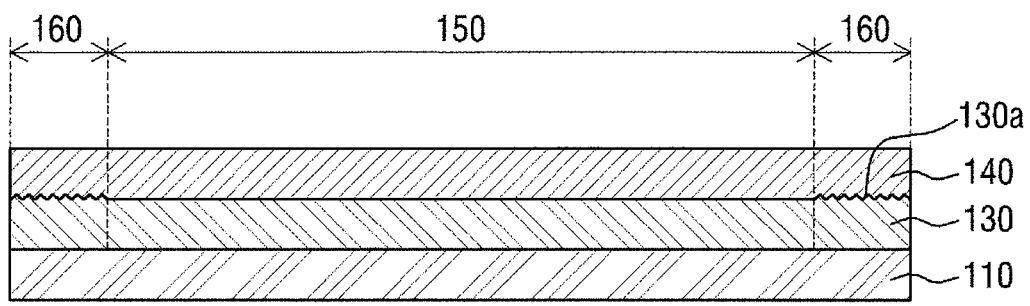
FIG. 2 is a cross-sectional view of the donor substrate taken along the line II-II of FIG. 1.

FIG. 1 is a plan view of a donor substrate 100 according to an embodiment of the present invention. FIG. 2 is a cross-sectional view of the donor substrate 100 taken along the line II-II of FIG. 1. Referring to FIGS. 1 and 2, the donor substrate 100 according to the current embodiment may include a base layer 110, a transfer assist layer 130, and a transfer layer 140.

The base layer 110 may be formed of transparent polymers. Examples of the transparent polymers include polyester (such as polyethylene terephthalate), polyacryl, polyepoxy, polyethylene, polystyrene, and the like. Among these examples, a polyethylene terephthalate film is commonly used. The base layer 110 may also be formed of glass. The base layer 110 should have optical properties and mechanical stability as a support film. The base layer 110 may have a thickness of 10 to 500 μm.

The base layer 110 may have a shape corresponding to that of an element substrate 710 (see FIG. 11) which will be described in more detail later. In an example embodiment, the shape and area of a surface of the base layer 110 may be the same as those of a surface of the element substrate 710. In another example embodiment, the base layer 110 may be large enough to fully cover the element substrate 710. In the example embodiment of FIG. 1, the base layer 110 may be quadrangular shaped when seen in a plan view.

The base layer 110 may include an element region 150 and an encapsulation region 160.

The element region 150 may correspond to a region of the element substrate 710 in which elements such as a first electrode 710b (see FIG. 11) and a pixel defining layer 710c (see FIG. 11) are formed. Specifically, if the donor substrate 100 and the element substrate 710 are laminated, the element region 150 may overlap the region of the element substrate 710 in which elements such as the first electrode 710b and the pixel defining layer 710c are formed.

The element region 150 may be located in the middle of the base layer 110. In the example embodiment of FIG. 1, the element region 150 may be quadrangular shaped when seen in a plan view.

The element region 150 may include a transfer region 150a and a non-transfer region 150b.

Figure 13:
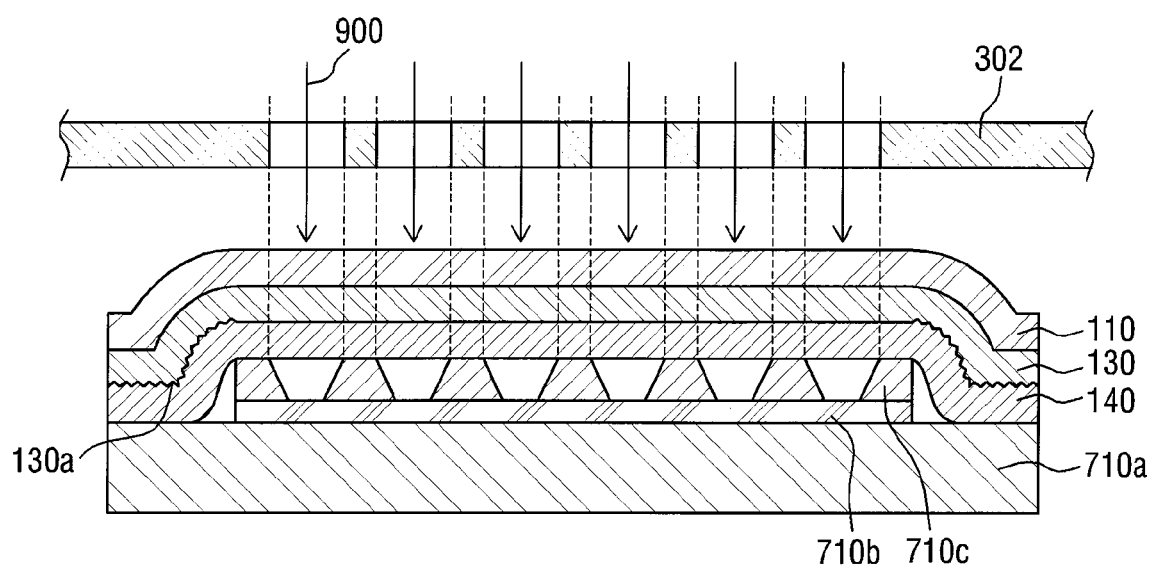
FIG. 13 is a cross-sectional view illustrating an operation of forming an organic layer on a first electrode of the element substrate by irradiating laser beams to the donor substrate of FIG. 1 in the method of manufacturing the OLED according to the embodiment of the present invention.

The transfer region 150a may be a region that is to be irradiated with laser beams 900 (see FIG. 13). In addition, the transfer region 150a may be a region whose transfer layer 140 disposed on the transfer assist layer 130 is to be transferred onto the element substrate 710. Further, the transfer region 150a may be formed in a region corresponding to each region of the first electrode 710b which is exposed by the pixel defining layer 710c. In the example embodiment of FIG. 1, the transfer region 150a may be shaped like a rectangle extending along one direction when seen in a plan view.

The transfer region 150a may be formed in the plural. In this case, the transfer regions 150a may be separated from each other by a set or predetermined distance. In addition, the transfer regions 150a may be rectangles extending along one direction and may be parallel to each other. The transfer regions 150a may respectively cover a plurality of regions of the first electrode 710b which are exposed by the pixel defining layer 710c.

Unlike the transfer region 150a, the non-transfer region 150b may be a region that is not to be irradiated with the laser beams 900. In addition, the non-transfer region 150b may be a region whose transfer layer 140 disposed on the transfer assist layer 130 is not to be transferred to the element substrate 710. Further, the non-transfer region 150b may correspond to a region of the first electrode 710b excluding the regions exposed by the pixel defining layer 710c.

The non-transfer region 150b may surround the transfer region 150a. In the example embodiment of FIG. 1, the transfer region 150a and the non-transfer region 150b may be arranged alternately along the line II-II.

The encapsulation region 160 may correspond to a region of the element substrate 710 in which elements such as the first electrode 710b and the pixel defining layer 710c are not formed. Specifically, if the donor substrate 100 and the element substrate 710 are laminated, the encapsulation region 160 may overlap the region of the element substrate 710 in which elements such as the first electrode 710b and the pixel defining layer 710c are not formed. In addition, the encapsulation region 160 may correspond to a region of the element substrate 710 in which an encapsulant 740 (see FIG. 16) is to be formed. Specifically, if the donor substrate 100 and the element substrate 710 are laminated, the encapsulation region 160 may overlap the region of the element substrate 710 in which the encapsulant 740 is to be formed.

The encapsulation region 160 may be located in an edge region of the base layer 110. In the example embodiment of FIG. 1, the encapsulation region 160 may be shaped like a picture frame when seen in a plan view. In addition, the encapsulation region 160 may surround the element region 150.

The transfer assist layer 130 may be disposed on the base layer 110. The transfer assist layer 130 may assist the transfer of the transfer layer 140 onto the element substrate 710. Specifically, the transfer assist layer 130 may convert the energy of the laser beams 900 irradiated to the donor substrate 100 into heat and transmit the heat to the transfer layer 140. As such, the transfer assist layer 130 may help the transfer layer 140 to be transferred onto the element substrate 710.

The transfer assist layer 130 may include a first uneven portion 130a. The first uneven portion 130a may be formed on the encapsulation region 160. In addition, the first uneven portion 130a may be formed on a surface of the transfer assist layer 130 which contacts the transfer layer 140. In an example embodiment, the first uneven portion 130a may be formed by plasma treatment. However, the present invention is not limited thereto, and the first uneven portion 130a may also be formed by treatment with other gases such as ozone. In addition, the first uneven portion 130a may include regular protruding and recessed shapes. However, the present invention is not limited thereto, and the first uneven portion 130a may also include irregular protruding and recessed shapes. Further, the surface of the transfer assist layer 130 which contacts the transfer layer 140 may be flat, excluding a region having the first uneven portion 130a. Specifically, a surface of the transfer assist layer 130 which contacts the transfer layer 140 disposed on the element region 150 may be flat. In the example embodiment of FIG. 1, a shaded region indicates a region in which the first uneven region 130a is formed.

The surface of the transfer assist layer 130 which contacts the transfer layer 140 may have a different surface energy in each region thereof. In an example embodiment, the surface energy of a surface of the transfer assist layer 130 which contacts the transfer layer 140 disposed on the encapsulation region 160 may be greater than that of the surface of the transfer assist layer 130 which contacts the transfer layer 140 disposed on the element region 150.

Although not shown in the drawings, the transfer assist layer 130 may include a light-to-heat conversion layer, an intermediate layer, and a buffer layer.

The light-to-heat conversion layer may be disposed on the base layer 110. The light-to-heat conversion layer absorbs light in an infrared-visible range and converts some of the light into heat. Here, the light-to-heat conversion layer should have optical density and includes a light absorbing material. The light-to-heat conversion layer may be a metal layer (which contains aluminum oxide or aluminum sulfide as the light absorbing material) or a polymer organic layer (which contains carbon black, graphite or infrared dye as the light absorbing material). If the light-to-heat conversion layer is a metal layer, it may be formed to a thickness of 100 to 5,000 Å by vacuum deposition, electron beam deposition or sputtering. If the light-to-heat conversion layer is a polymer organic layer, it may be formed to a thickness of 0.1 to 10 μm by a typical film coating method such as roll coating, gravure coating, extrusion coating, spin coating, or knife coating.

The intermediate layer may be disposed between the light-to-heat conversion layer and the transfer layer 140. The intermediate layer may prevent the light absorbing material (e.g., carbon black) of the light-to-heat conversion layer from contaminating the transfer layer 140 formed in a subsequent process. The intermediate layer may be formed of acrylic resin or alkyd resin. The intermediate layer may be formed by a typical coating process such as solvent coating and a curing process such as ultraviolet curing.

The buffer layer may be disposed between the light-to-heat conversion layer and the transfer layer 140, or, if the intermediate layer is present, between the intermediate layer and the transfer layer 140. The buffer layer may be formed to prevent damage to organic layers in the transfer layer 140 and effectively adjust the adhesion between the light-to-heat conversion layer and the transfer layer 140, or, if the intermediate layer is present, between the intermediate layer and the transfer layer 140. The buffer layer may contain at least one of an insulating material, a metal, and a metal oxide.

The transfer layer 140 may be disposed on the transfer assist layer 130. The transfer layer 140 may be separated from the donor substrate 100 by thermal energy transmitted from the transfer assist layer 130 and then patterned or transferred to form an organic layer 720 on the element substrate (see FIG. 14).

The transfer layer 140 may include organic material layers included in an organic light-emitting display device (OLED), that is, an organic light-emitting layer (EML), a hole injection layer (HIL), a hole transport layer (HTL), an electron injection layer (EIL), an electron transport layer (ETL), etc. The transfer layer 140 may have a single layer structure including one layer selected from the above organic material layers or a multilayer structure including two or more layers selected from the above organic material layers.

The EML may contain organic light-emitting materials for generating light of different colors, such as red light, green light, blue light, etc. In other example embodiments, the EML may be formed to mix the organic light-emitting materials so as to emit white light. In addition, the EML may use the organic light-emitting materials as a dopant and may additionally contain a host material. Here, appropriate dopant and host materials may be selected according to whether the EML generates light using a fluorescent mechanism or a phosphorescent mechanism.

Examples of an organic material contained in the HIL may include TCTA, m-TDATA, m-MTDAPB and 2-TNATA, and examples of an organic material contained in the HTL may include NPB, TPD, α-NPD, N-phenylcarbazole and polyvinylcarbazole. In addition, examples of an organic material contained in the ETL may include Alq, PBD, TAZ and rubrene, and examples of an organic material contained in the EIL may include alkali metals (e.g., lithium (Li), sodium (Na), cesium (Cs), etc.), alkaline earth metals (e.g., barium (Ba), etc.), fluorides of these metals, chlorides of these metals and oxides of these metals.

The transfer layer 140 may be formed all over the element region 150 and the encapsulation region 160. In addition, the transfer layer 140 may contact the surface of the transfer assist layer 130 which includes the first uneven portion 130a. The adhesion between the transfer layer 140 and the transfer assist layer 130 may differ in each region. In an example embodiment, the adhesion between the transfer layer 140 and the transfer assist layer 130 on the encapsulation region 160 may be stronger than the adhesion between the transfer layer 140 and the transfer assist layer 130 on the element region 150.

As described above, in the donor substrate 100 according to the current embodiment, only the transfer layer 140 disposed on the element region 150 is separated from the donor substrate 100 and transferred to the element substrate 710. That is, the transfer layer 140 disposed on the encapsulation region 160 may not be separated from the donor substrate 100. In other words, the transfer layer 140 disposed on the encapsulation region 160 may not be transferred to the element substrate 710. Therefore, it is possible to prevent an "unwanted transfer" phenomenon in which the transfer layer 140 is transferred to a region of the element substrate 710 which corresponds to the encapsulation region 160 (that is, a region of the element substrate 710 where the encapsulant 740 is to be formed) and thus forms the organic layer 720. Accordingly, because the organic layer 720 does not exist in the region of the element substrate 710 which corresponds to the encapsulation region 160, that is, the region of the element substrate 710 where the encapsulant 740 is to be formed, the region of the element substrate 710 where the encapsulant 740 is to be formed may be clean. If the encapsulant 740 is formed on this clean region of the element substrate 710, it may be completely attached to the element substrate 710, thereby preventing oxygen or moisture from penetrating into the OLED and reducing the efficiency and the life of the OLED. That is, the encapsulant 740 formed on this clean region of the element substrate 710 can prevent encapsulation defects of the OLED.

Figure 3:
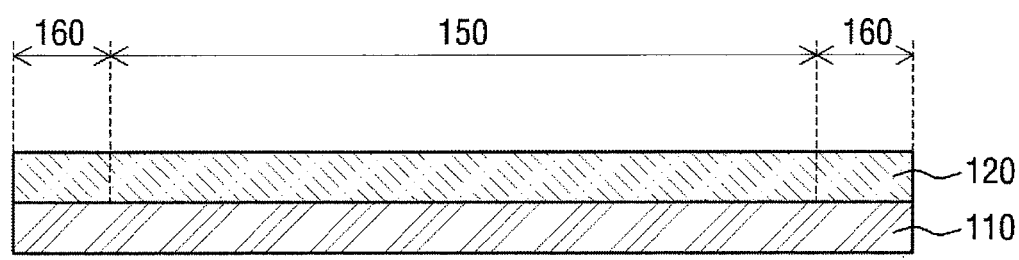
FIG. 3 is a cross-sectional view illustrating an operation of forming a preliminary transfer assist layer on a base layer in a method of manufacturing the donor substrate of FIG. 1.
Figure 4:
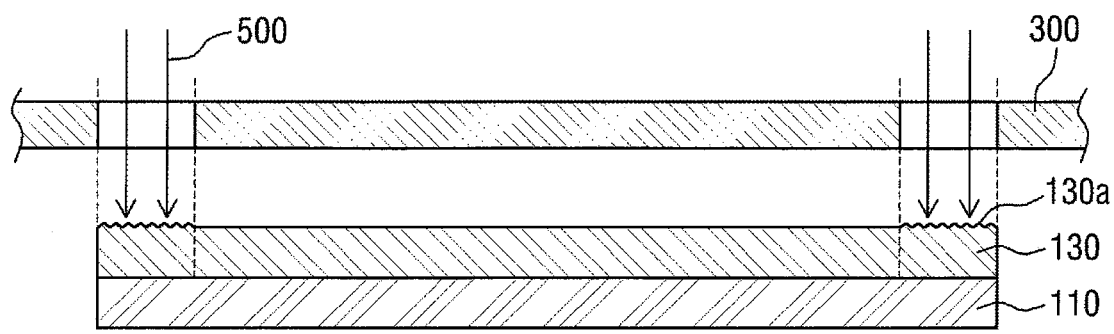
FIG. 4 is a cross-sectional view illustrating an operation of converting the preliminary transfer assist layer into a transfer assist layer in the method of manufacturing the donor substrate of FIG. 1.
Figure 5:
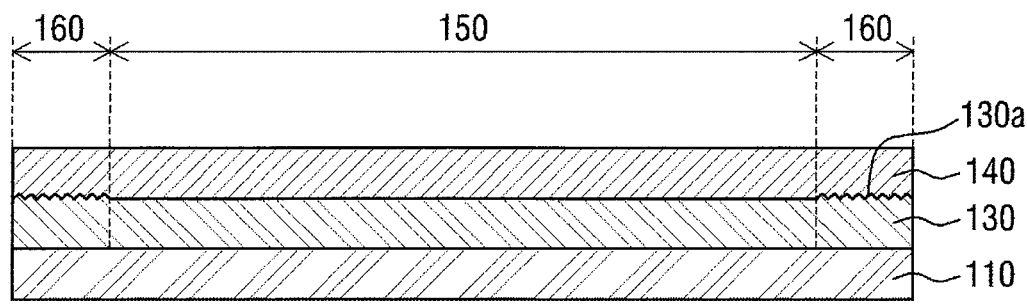
FIG. 5 is a cross-sectional view illustrating an operation of forming a transfer layer on the transfer assist layer in the method of manufacturing the donor substrate of FIG. 1.

A method of manufacturing the donor substrate 100 according to an embodiment of the present invention will now be described with reference to FIGS. 3 through 5. FIG. 3 is a cross-sectional view illustrating an operation of forming a preliminary transfer assist layer 120 on a base layer 110 in a method of manufacturing the donor substrate 100 of FIG. 1. FIG. 4 is a cross-sectional view illustrating an operation of converting the preliminary transfer assist layer 120 into a transfer assist layer 130 in the method of manufacturing the donor substrate 100 of FIG. 1. FIG. 5 is a cross-sectional view illustrating an operation of forming a transfer layer 140 on the transfer assist layer 130 in the method of manufacturing the donor substrate 100 of FIG. 1. For simplicity, elements substantially identical to those of FIGS. 1 and 2 are indicated by like reference numerals, and thus a redundant description thereof will be omitted.

Referring to FIG. 3, the base layer 110 may be prepared, and then the preliminary transfer assist layer 120 may be formed on the base layer 110. Here, the preliminary transfer assist layer 120 may be the transfer assist layer 130 before being treated with plasma 500. Therefore, the preliminary transfer assist layer 120 may be formed of substantially the same material as the transfer assist layer 130 and may have substantially the same stacked structure as the transfer assist layer 130.

When a metal is used, the preliminary transfer assist layer 120 may be formed by a vacuum deposition process, an electron beam deposition process, a sputtering process, or the like. When a polymer is used, the preliminary transfer assist layer 120 may be formed by a typical coating process such as a roll coating process, an extrusion coating process, a spin coating process, a knife coating process, or the like.

Referring to FIG. 4, after the formation of the preliminary transfer assist layer 120 on the base layer 110, the preliminary transfer assist layer 120 may be converted into the transfer assist layer 130 by selectively treating the preliminary transfer assist layer 120 with the plasma 500. In an example embodiment, the preliminary transfer assist layer 120 disposed on an encapsulation region 160 may be treated with the plasma 500 by using a mask 300 having an opening corresponding to the encapsulation region 160. When the preliminary transfer assist layer 120 disposed on the encapsulation region 160 is treated with the plasma 500, the plasma 500 may react strongly with molecules of a surface of the preliminary transfer assist layer 120 disposed on the encapsulation region 160, thereby changing the molecular structure of the surface of the preliminary transfer assist layer 120 disposed on the encapsulation region 160. In an example embodiment, fine protrusions and recesses may be formed in the surface of the preliminary transfer assist layer 120 disposed on the encapsulation region 160. In another example embodiment, the preliminary transfer assist layer 120 disposed on the encapsulation region 160 may overall be pared. In another example embodiment, the surface energy of a portion treated with the plasma 500, that is, the surface energy of a surface of the transfer assist layer 130 disposed on the encapsulation region 160 may be higher than the surface energy of a portion not treated with the plasma 500, that is, the surface energy of a surface of the transfer assist layer 130 disposed on the element region 150.

If only the preliminary transfer assist layer 120 disposed on the encapsulation region 160 is treated with the plasma 500 as described above, a first uneven portion 130a may be formed on the surface of the preliminary transfer assist layer 120 disposed on the encapsulation region 160. That is, the preliminary transfer assist layer 120 can be converted into the transfer assist layer 130 by reforming the surface of the preliminary transfer assist layer 120 through treatment with the plasma 500.

The above-described plasma treatment is not only an environment-friendly surface treatment technology that does not produce harmful substances but also has an effect of removing foreign substances attached to the surface of the preliminary transfer assist layer 120 by changing the molecular structure of the surface of the preliminary transfer assist layer 120. In addition, because the plasma treatment does not include a chemical surface pre-treatment process using a solvent or chromic acid or an adhesive coating process, it does not produce materials harmful to water quality and the atmospheric environment.

Referring to FIG. 5, after the conversion of the preliminary transfer assist layer 120 into the transfer assist layer 130, the transfer layer 140 may be formed on the transfer assist layer 130. The transfer layer 140 may be formed using appropriate organic materials according to the organic material layers included therein through a vacuum deposition process, a spin coating process, a thermal deposition process, or the like. In an example embodiment, the transfer layer 140 may be formed all over an element region 150 and the encapsulation region 160. Here, the adhesion between the transfer layer 140 and the transfer assist layer 130 may differ in each region. That is, the adhesion between the transfer layer 140 and the transfer assist layer 130 on the encapsulation region 160 may be stronger than the adhesion between the transfer layer 140 and the transfer assist layer 130 on the element region 150.

As described above, in the method of manufacturing the donor substrate 100 according to the current embodiment, the adhesion between the transfer layer 140 and the transfer assist layer 130 is adjusted to be different in each region by plasma treatment so as to prevent an "unwanted transfer" phenomenon in which the transfer layer 140 is transferred to a region of an element substrate 710 where an encapsulant 740 is to be formed and thus forms an organic layer 720. Accordingly, the region of the element substrate 710 where the encapsulant 740 is to be formed can be maintained clean. If the donor substrate 100 manufactured using this method is employed to manufacture an OLED, encapsulation defects of the OLED can be prevented or reduced.

Figure 6:
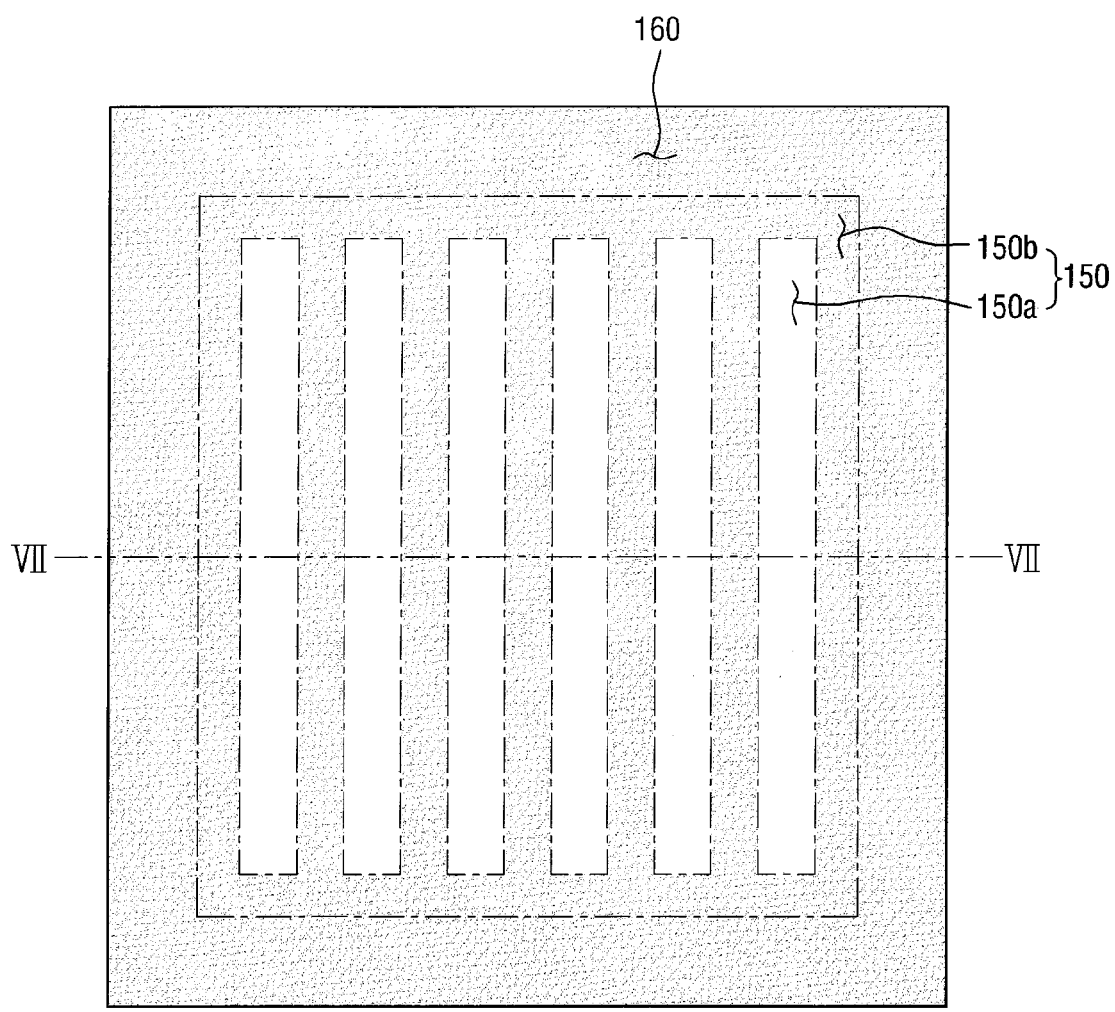
FIG. 6 is a plan view of a donor substrate according to another embodiment of the present invention.
Figure 7:
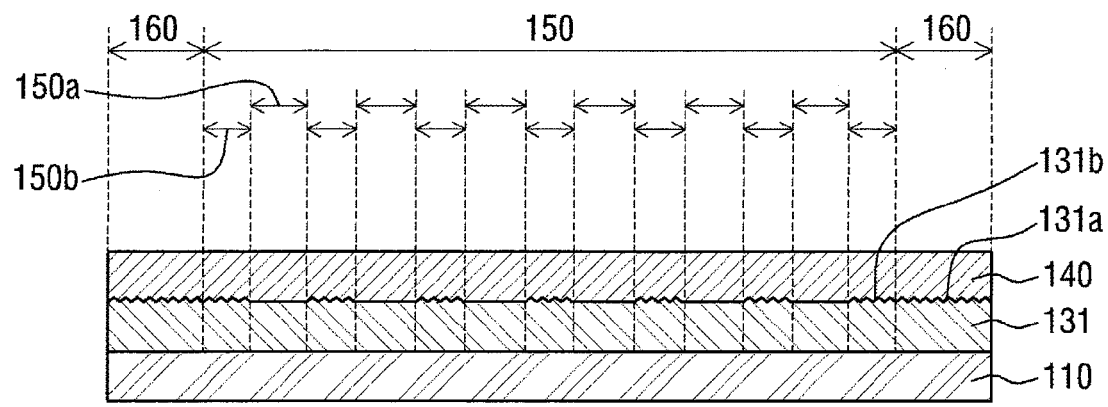
FIG. 7 is a cross-sectional view of the donor substrate taken along the line VII-VII of FIG. 6.

FIG. 6 is a plan view of a donor substrate 101 according to another embodiment of the present invention. FIG. 7 is a cross-sectional view of the donor substrate 101 taken along the line VII-VII of FIG. 6. For simplicity, elements substantially identical to those of FIGS. 1 and 2 are indicated by like reference numerals, and thus a redundant description thereof will be omitted.

Referring to FIGS. 6 and 7, a transfer assist layer 131 may include a first uneven portion 131a disposed on an encapsulation region 160 and a second uneven portion 131b disposed on a non-transfer region 150b. Here, the first uneven portion 131a and the second uneven portion 131b may be formed at different locations but may have substantially the same shape (shape of protrusions and recessions on the surface). That is, the first uneven portion 131a and the second uneven portion 131b may have substantially the same shape and may be formed using substantially the same method. In an example embodiment, the first uneven portion 131a and the second uneven portion 131b may be formed by plasma treatment. However, the present invention is not limited thereto, and the first uneven portion 131a and the second uneven portion 131b may also be formed by treatment with other gases such as ozone. In addition, the first uneven portion 131a and the second uneven portion 131b may include regular protruding and recessed shapes. However, the present invention is not limited thereto, and the first uneven portion 131a and the second uneven portion 131b may also include irregular protruding and recessed shapes. Further, a surface of the transfer assist layer 131 which contacts a transfer layer 140 may be flat, excluding a region having the first uneven portion 131a and the second uneven portion 131b. Specifically, a surface of the transfer assist layer 131 which contacts the transfer layer 140 disposed on a transfer region 150a of an element region 150 may be flat. In an example embodiment, an average height of the surface of the transfer assist layer 131 which contacts the transfer layer 140 disposed on the transfer region 150a of the element region 150 may be greater than or equal to an average height of the first uneven portion 131a disposed on the non-transfer region 150b and the encapsulation region 160. In the example embodiment of FIG. 6, a shaded region indicates a region in which the first uneven region 131a and the second uneven portion 131b are formed.

The surface of the transfer assist layer 131 which contacts the transfer layer 140 may have a different surface energy in each region thereof. In an example embodiment, the surface energy of the surface of the transfer assist layer 131 which contacts the transfer layer 140 disposed on the non-transfer region 150b and the encapsulation region 160 may be greater than that of a surface of the transfer assist layer 131 which contacts the transfer layer 140 disposed on the transfer region 150a.

The transfer layer 140 may be formed all over the element region 150 and the encapsulation region 160. In addition, the transfer layer 140 may contact the surface of the transfer assist layer 131 which includes the first uneven portion 131a and the second uneven portion 131b. The adhesion between the transfer layer 140 and the transfer assist layer 131 may differ in each region. In an example embodiment, the adhesion between the transfer layer 140 and the transfer assist layer 131 on the non-transfer region 150b and the encapsulation region 160 may be stronger than the adhesion between the transfer layer 140 and the transfer assist layer 131 on the transfer region 150a.

As described above, in the donor substrate 101 according to the current embodiment, only the transfer layer 140 disposed on the transfer region 150a is separated from the donor substrate 101 and transferred to an element substrate 710. That is, the transfer layer 140 disposed on the non-transfer region 150b and the encapsulation region 160 may not be separated from the donor substrate 101. In other words, the transfer layer 140 on the non-transfer region 150b and the encapsulation region 160 may not be transferred to the element substrate 710. Therefore, it is possible to prevent an "unwanted transfer" phenomenon in which the transfer layer 140 is transferred to a region of the element substrate 710 which corresponds to the non-transfer region 150b and the encapsulation region 160 and thus forms an organic layer 720. Accordingly, the organic layer 720 may not exist in the region of the element substrate 710 which corresponds to the non-transfer region 150b and the encapsulation region 160. Therefore, if this donor substrate 101 is used to manufacture an OLED, encapsulation defects, etc. of the OLED can be prevented or reduced.

Figure 8:
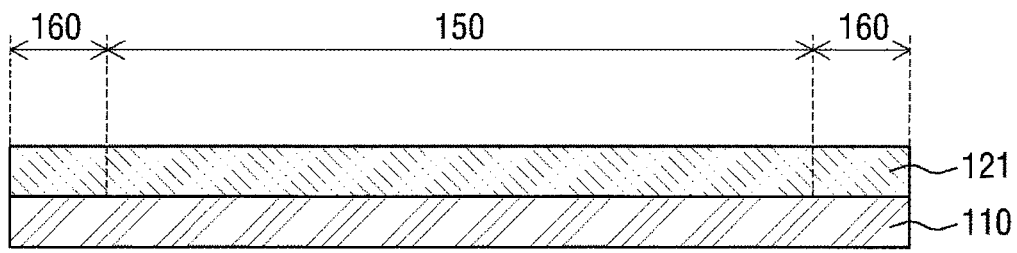
FIG. 8 is a cross-sectional view illustrating an operation of forming a preliminary transfer assist layer on a base layer in a method of manufacturing the donor substrate of FIG. 6.
Figure 9:
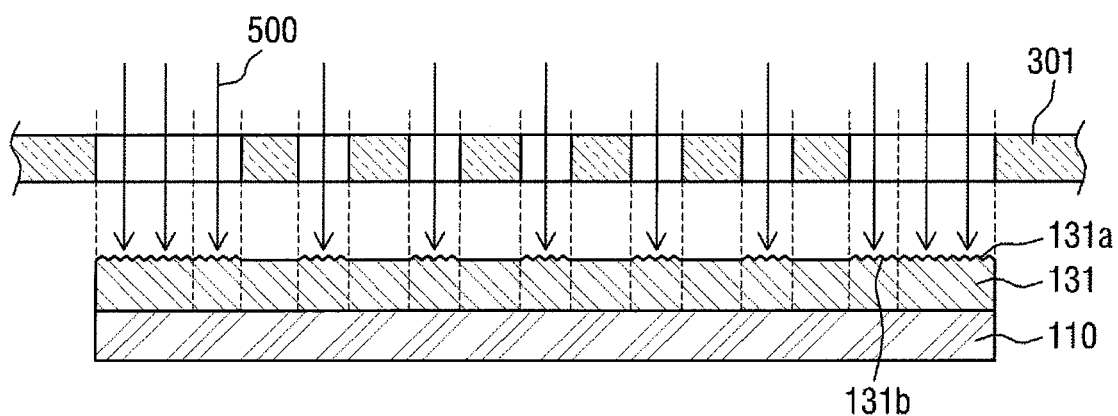
FIG. 9 is a cross-sectional view illustrating an operation of converting the preliminary transfer assist layer into a transfer assist layer in the method of manufacturing the donor substrate of FIG. 6.
Figure 10:
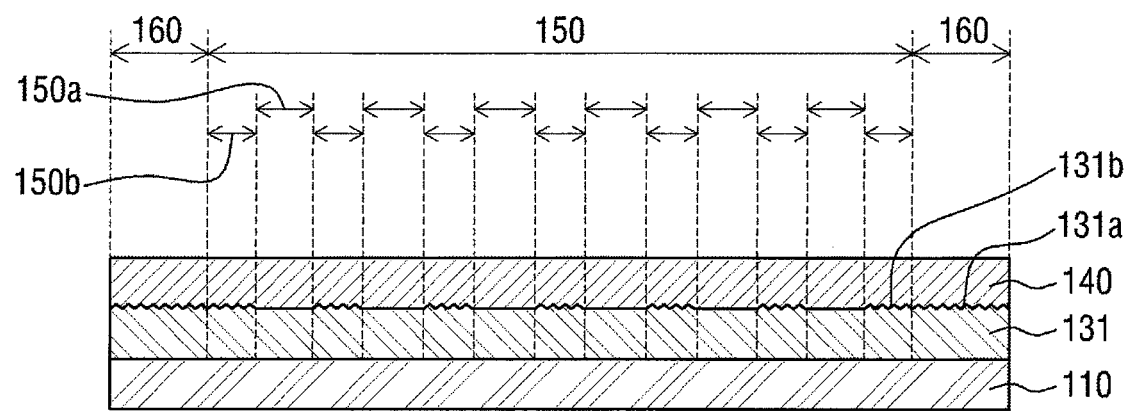
FIG. 10 is a cross-sectional view illustrating an operation of forming a transfer layer on the transfer assist layer in the method of manufacturing the donor substrate of FIG. 6.

A method of manufacturing the donor substrate 101 according to another embodiment of the present invention will now be described with reference to FIGS. 8 through 10. FIG. 8 is a cross-sectional view illustrating an operation of forming a preliminary transfer assist layer 121 on a base layer 110 in a method of manufacturing the donor substrate 101 of FIG. 6. FIG. 9 is a cross-sectional view illustrating an operation of converting the preliminary transfer assist layer 121 into a transfer assist layer 131 in the method of manufacturing the donor substrate 101 of FIG. 6. FIG. 10 is a cross-sectional view illustrating an operation of forming a transfer layer 140 on the transfer assist layer 131 in the method of manufacturing the donor substrate 101 of FIG. 6. For simplicity, elements substantially identical to those of FIGS. 6 and 7 are indicated by like reference numerals, and thus a redundant description thereof will be omitted. In addition, the operations of FIGS. 8, 9 and 10 respectively correspond to the operations of FIGS. 3, 4 and 5, and thus a redundant description thereof will be omitted.

Referring to FIG. 8, the base layer 110 may be prepared, and then the preliminary transfer assist layer 121 may be formed on the base layer 110. Here, the preliminary transfer assist layer 121 may be the transfer assist layer 131 before being treated with plasma 500.

Referring to FIG. 9, after the formation of the preliminary transfer assist layer 121 on the base layer 110, the preliminary transfer assist layer 121 may be converted into the transfer assist layer 131 by selectively treating the preliminary transfer assist layer 121 with the plasma 500. In an example embodiment, the preliminary transfer assist layer 121 disposed on a non-transfer region 150b and an encapsulation region 160 may be treated with the plasma 500 by using a mask 301 having openings corresponding to the non-transfer region 150b and the encapsulation region 160. In the example embodiment of FIG. 9, a case where the preliminary transfer assist layer 121 disposed on the non-transfer region 150b and the preliminary transfer assist layer 121 disposed on the encapsulation region 160 are simultaneously or concurrently treated with the plasma 500. However, the present invention is not limited to this case, and they can also be separately treated with the plasma 500 in different operations.

If only the preliminary transfer assist layer 121 disposed on the non-transfer region 150b and the encapsulation region 160 is treated with the plasma 500 as described above, a first uneven portion 131a may be formed on a surface of the preliminary transfer assist layer 121 disposed on the encapsulation region 160, and a second uneven portion 131b may be formed on a surface of the preliminary transfer assist layer 121 disposed on the non-transfer region 150b.

Referring to FIG. 10, after the conversion of the preliminary transfer assist layer 121 into the transfer assist layer 131, the transfer layer 140 may be formed on the transfer assist layer 131. In an example embodiment, the transfer layer 140 may be formed all over an element region 150 and the encapsulation region 160. Here, the adhesion between the transfer layer 140 and the transfer assist layer 131 may differ in each region. That is, the adhesion between the transfer layer 140 and the transfer assist layer 131 on the non-transfer region 150b and the encapsulation region 160 may be stronger than the adhesion between the transfer layer 140 and the transfer assist layer 131 on a transfer region 150a. In addition, the adhesion between the transfer layer 140 and the transfer assist layer 131 on the non-transfer region 150b may be substantially equal to the adhesion between the transfer layer 140 and the transfer assist layer 131 on the encapsulation region 160.

As described above, in the method of manufacturing the donor substrate 101 according to the current embodiment, the adhesion between the transfer layer 140 and the transfer assist layer 131 is adjusted to be different in each region by plasma treatment so as to prevent an "unwanted transfer" phenomenon in which the transfer layer 140 is transferred to a region of an element substrate 710 which corresponds to the non-transfer region 150b and the encapsulation region 160 and thus forms an organic layer 720. If the donor substrate 101 manufactured using the method is employed to manufacture an OLED, encapsulation defects, etc. of the OLED can be prevented or reduced.

Figure 11:
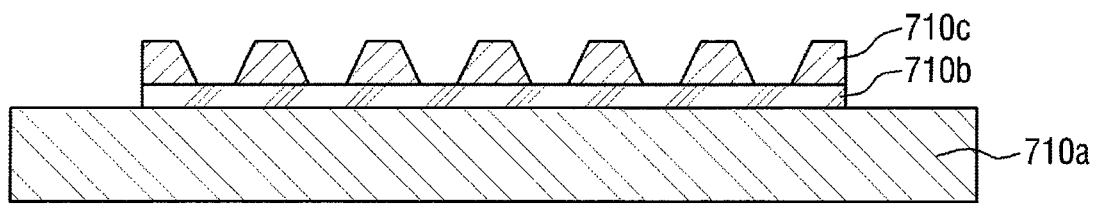
FIG. 11 is a cross-sectional view illustrating an operation of providing an element substrate in a method of manufacturing an organic light-emitting display device (OLED) according to an embodiment of the present invention.
Figure 12:
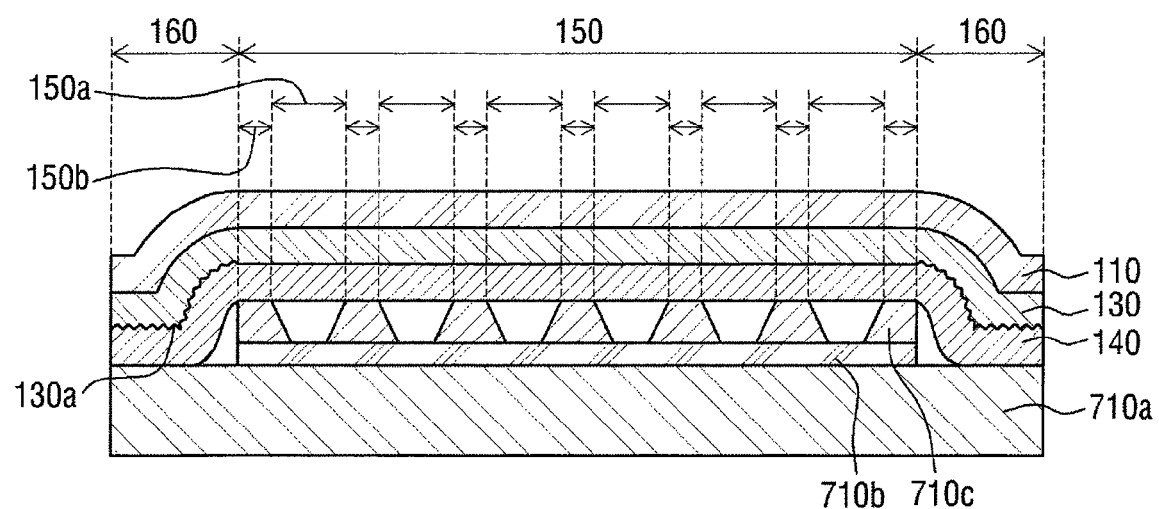
FIG. 12 is a cross-sectional view illustrating an operation of laminating the donor substrate of FIG. 1 and the element substrate in the method of manufacturing the OLED according to the embodiment of the present invention.
Figure 14:
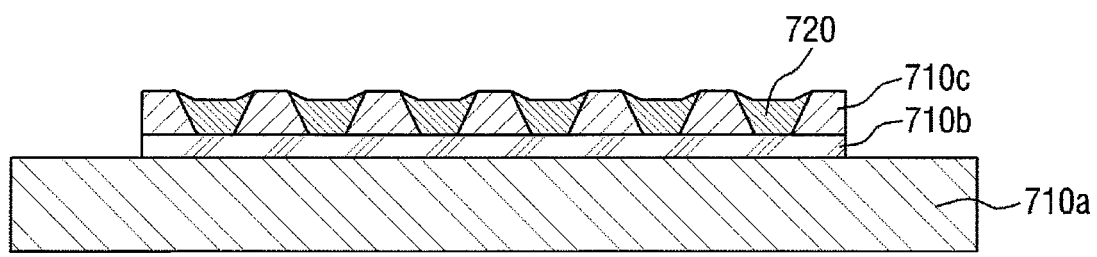
FIG. 14 is a cross-sectional view illustrating an operation of separating the donor substrate of FIG. 1 from the element substrate in the method of manufacturing the OLED according to the embodiment of the present invention.
Figure 15:
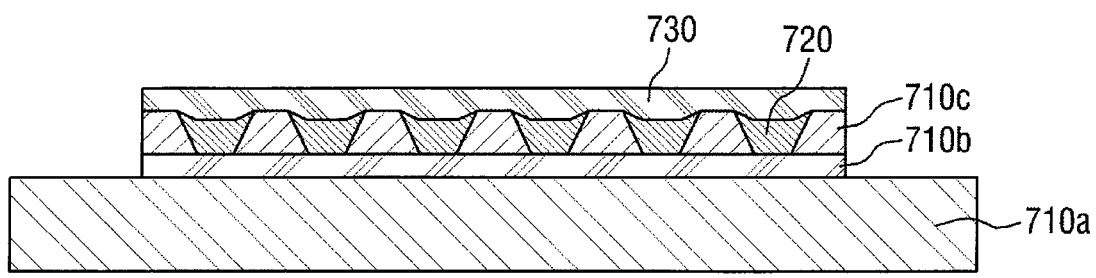
FIG. 15 is a cross-sectional view illustrating an operation of forming a second electrode on the organic layer in the method of manufacturing the OLED according to the embodiment of the present invention.
Figure 16:
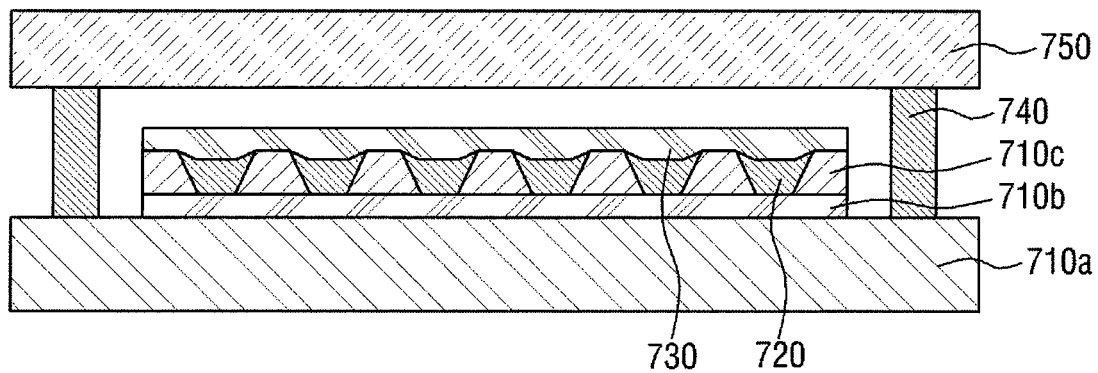
FIG. 16 is a cross-sectional view illustrating an operation of forming an encapsulant and an encapsulation substrate on a base substrate in the method of manufacturing the OLED according to the embodiment of the present invention.

A method of manufacturing an OLED 700 according to an embodiment of the present invention will now be described with reference to FIGS. 11 through 16. FIGS. 11 through 16 illustrate operations in a method of manufacturing the OLED 700 using the donor substrate 100 of FIG. 1. Specifically, FIG. 11 is a cross-sectional view illustrating an operation of providing an element substrate 710 in a method of manufacturing the OLED 700 according to an embodiment of the present invention. FIG. 12 is a cross-sectional view illustrating an operation of laminating the donor substrate 100 of FIG. 1 and the element substrate 710 in the method of manufacturing the OLED 700 according to the embodiment of the present invention. FIG. 13 is a cross-sectional view illustrating an operation of forming an organic layer 720 on a first electrode 710b of the element substrate 710 by irradiating laser beams 900 to the donor substrate 100 of FIG. 1 in the method of manufacturing the OLED 700 according to the embodiment of the present invention. FIG. 14 is a cross-sectional view illustrating an operation of separating the donor substrate 100 of FIG. 1 from the element substrate 710 in the method of manufacturing the OLED 700 according to the embodiment of the present invention. FIG. 15 is a cross-sectional view illustrating an operation of forming a second electrode 730 on the organic layer 720 in the method of manufacturing the OLED 700 according to the embodiment of the present invention. FIG. 16 is a cross-sectional view illustrating an operation of forming an encapsulant 740 and an encapsulation substrate 750 on a base substrate 710a in the method of manufacturing the OLED 700 according to the embodiment of the present invention. For simplicity, elements substantially identical to those of FIGS. 1 and 2 are indicated by like reference numerals, and thus a redundant description thereof will be omitted.

Referring to FIG. 11, the element substrate 710 may be prepared. The element substrate 710 may include the base substrate 710a, the first electrode 710b formed on the base substrate 710a, and a pixel defining layer 710c exposing some regions of the first electrode 710b.

The base substrate 710a may be a transparent insulating substrate formed of glass, quartz, ceramic, plastic, etc. The base substrate 710a may be shaped like a flat plate and may be a flexible substrate that can be easily bent by an external force.

The first electrode 710b may be disposed on the base substrate 710a. The first electrode 710b may be provided in the plural, and the first electrode 710b may have a plurality of regions exposed through a plurality of opening regions defined by the pixel defining layer 710c.

The first electrode 710b may be formed of a reflective conductive material, a transparent conductive material, or a semi-transparent conductive material. The reflective conductive material may be lithium (Li), calcium (Ca), lithium fluoride/calcium (LiF/Ca), lithium fluoride/aluminum (LiF/Al), aluminum (Al), silver (Ag), magnesium (Mg), or gold (Au). The transparent conductive material may be indium tin oxide (ITO), indium zinc oxide (IZO), zinc oxide (ZnO), or indium oxide ($In_2O_3$). Also, the semi-transparent conductive material may be a co-deposition material containing one or more of Mg and Ag or may be one or more of Mg, Ag, Ca, Li, and Al. The first electrode 710b may consist of multiple layers and may exhibit reflective, transparent, or semi-transparent characteristics depending on the stacked structure of the multiple layers. The first electrode 710b may be formed by a sputtering process, an atomic layer deposition process, a vacuum deposition process, a printing process, or the like.

The pixel defining layer 710c may be formed on the first electrode 710b. The pixel defining layer 710c may include the opening regions arranged in a matrix. The pixel defining layer 710c may be formed of an organic insulating material or an inorganic insulating material. In addition, the pixel defining layer 710c may be formed of a photosensitizer that contains a black pigment. In this case, the pixel defining layer 710c may serve as a light blocking member. In an example embodiment, the pixel defining layer 710c may be formed by forming a photosensitive material layer (such as acrylic resin, polyimide, benzocyclobutene (BCB), etc.) on the first electrode 710b and partially removing the photosensitive material layer through a selective exposure and development process. In other example embodiments, the pixel defining layer 710c may be formed by forming a non-photosensitive organic or inorganic material layer on the first electrode 710b and then partially etching the non-photosensitive organic or inorganic material layer.

Although not shown in the drawing, the element substrate 710 may include structures such as a switching element (which includes a thin-film transistor (TFT) structure, an oxide semiconductor structure, etc.), an insulating layer, and the like.

Referring to FIG. 12, after the preparation of the element substrate 710, the donor substrate 100 may be placed such that a transfer layer 140 faces the first electrode 710b of the element substrate 710, and then the donor substrate 100 and the element substrate 710 may be laminated. If the donor substrate 100 and the element substrate 710 are laminated, the transfer layer 140 of the donor substrate 100 may partially contact the base substrate 710a and the pixel defining layer 710c.

Here, a region of the element substrate 710 in which elements such as the first electrode 710b and the pixel defining layer 710c are formed may correspond to an element region 150 described above. Specifically, if the donor substrate 100 and the element substrate 710 are laminated, the region of the element substrate 710 in which elements such as the first electrode 710b and the pixel defining layer 710c are formed may be overlapped by the element region 150.

Also, a region of the element substrate 710 in which each region of the first electrode 710b exposed by the pixel defining layer 710c is disposed may correspond to a transfer region 150a described above. Specifically, if the donor substrate 100 and the element substrate 710 are laminated, the region of the element substrate 710 in which each region of the first electrode 710b exposed by the pixel defining layer 710c is disposed may be overlapped by the transfer region 150a.

In addition, a region of the element substrate 710 in which the pixel defining layer 710c is disposed may correspond to a non-transfer region 150b described above. Specifically, if the donor substrate 100 and the element substrate 710 are laminated, the region of the element substrate 710 in which the pixel defining layer 710c is disposed may be at least partially overlapped by the non-transfer region 150b.

Further, a region of the element substrate 710 in which elements such as the first electrode 710b and the pixel defining layer 710c are not formed may correspond to an encapsulation region 160 described above. Specifically, if the donor substrate 100 and the element substrate 710 are laminated, the region of the element substrate 710 in which elements such as the first electrode 710b and the pixel defining layer 710c are not formed may be overlapped by the encapsulation region 160.

Referring to FIG. 13, after the lamination of the donor substrate 100 and the element substrate 710, the transfer region 150a of the donor substrate 100 may be irradiated with the laser beams 900 by using a mask 302 having openings, each corresponding to the transfer region 150a. As a result, the organic layer 720 may be formed on the first electrode 710b of the element substrate 710. The organic layer 720 may include an EML described above.

Here, because the adhesion between the transfer layer 140 and a transfer assist layer 130 on the encapsulation region 160 of the donor substrate 100 is stronger than the adhesion between the transfer layer 140 and the transfer assist layer 130 on the element region 150 of the donor substrate 100, only the transfer layer 140 disposed on the element region 150, specifically, on the transfer region 150a may be separated from the donor substrate 100 and transferred to the element substrate 710. That is, the transfer layer 140 disposed on the encapsulation region 160 may not be separated from the donor substrate 100. In other words, the transfer layer 140 disposed on the encapsulation region 160 may not be transferred to the element substrate 710. Therefore, it is possible to prevent an "unwanted transfer" phenomenon in which the transfer layer 140 is transferred to a region of the element substrate 710 which corresponds to the encapsulation region 160 (that is, a region of the element substrate 710 where an encapsulant 740 is to be formed) and thus forms the organic layer 720. Accordingly, because the organic layer 720 does not exist in the region of the element substrate 710 which corresponds to the encapsulation region 160, that is, the region of the element substrate 710 where the encapsulant 740 is to be formed, the region of the element substrate 710 where the encapsulant 740 is to be formed may be clean.

Referring to FIG. 14, after the formation of the organic layer 720 on the first electrode 710b of the element substrate 710, the donor substrate 100 may be separated from the element substrate 710. That is, the used donor substrate 100 may be removed from the element substrate 710.

When the donor substrate 100 is separated from the element substrate 710, the transfer layer 140 existing on the encapsulation region 160 of the donor substrate 100 may be completely removed from the base substrate 710a without remaining on the base substrate 710a. This is possible because the adhesion between the transfer layer 140 and the transfer assist layer 130 on the encapsulation region 160 of the donor substrate 100 is stronger than the adhesion between the transfer layer 140 and the transfer assist layer 130 on the element region 150 of the donor substrate 100.

Referring to FIG. 15, after the separation of the donor substrate 100 from the element substrate 710, the second electrode 730 may be formed on the organic layer 720. The second electrode 730 may be formed of a reflective conductive material, a transparent conductive material, or a semi-transparent conductive material. The reflective conductive material may be Li, Ca, LiF/Ca, LiF/Al, Al, Ag, Mg, or Au. The transparent conductive material may be ITO, IZO, ZnO, or $In_2O_3$. Also, the semi-transparent conductive material may be a co-deposition material containing one or more of Mg and Ag or may be one or more of Mg, Ag, Ca, Li, and Al. The second electrode 730 may be formed by a sputtering process, an atomic layer deposition process, a vacuum deposition process, a printing process, or the like.

Although not shown in the drawing, the method of manufacturing the OLED 700 according to the current embodiment may further include an operation of forming a passivation layer which surrounds the first electrode 710b, the pixel defining layer 710c, and the second electrode 730 after the formation of the second electrode 730 on the organic layer 720. The passivation layer may be an organic layer, an inorganic layer or a multilayer composed of these layers. The inorganic layer may be an insulating layer such as a silicon oxide ($SiO_2$) layer, a silicon nitride (SiNx) layer, or a silicon oxynitride ($SiO_xN_y$) layer. Also, the inorganic layer may be a LiF layer. The organic layer may be a layer containing NPB(N,N'-Bis (naphthalen-1-yl)-N,N'-bis(phenyl)benzidine), TNATA, TCTA, TDAPB, TDATA, $Alq_3$, BAlq or CBP.

Referring to FIG. 16, after the formation of the second electrode 730 on the organic layer 720, the encapsulant 740 and an encapsulation substrate 750 may be formed on the base substrate 710a. That is, the OLED 700 may be encapsulated. The encapsulant 740 may be formed of glass frit, and the encapsulation substrate 750 may be formed of insulating glass or plastic. However, the materials that form the encapsulant 740 and the encapsulation substrate 750 are not limited to those set forth herein, and the encapsulant 740 and the encapsulation substrate 750 may be formed of various suitable materials that can block external substances.

The encapsulant 740 may be formed in a region of the element substrate 710 which corresponds to the encapsulation region 160. In an example embodiment, the encapsulant 740 may be formed on an edge region of the base substrate 710a. The encapsulant 740 may connect the base substrate 710a and the encapsulation substrate 750. An internal space surrounded by the encapsulant 740, the base substrate 710a, and the encapsulation substrate 750 may be isolated from the outside environment. That is, the encapsulant 740, the base substrate 710a, and the encapsulation substrate 750 may prevent external substances from penetrating into the organic layer 720, etc.

Because the region of the element substrate 710 intended for the formation of the encapsulant 740 is clean, the encapsulant 740 may be completely attached to the element substrate 710. Therefore, it is possible to prevent oxygen or moisture from penetrating into the OLED 700 and reducing the efficiency and the life of the OLED 700. That is, encapsulation defects, etc. of the OLED 700 can be prevented or reduced.

In the example embodiment described above with reference to FIGS. 11 through 16, the method of manufacturing the OLED 700 using the donor substrate 100 of FIG. 1 is illustrated. However, the present invention is not limited thereto, and the OLED 700 can also be manufactured using the donor substrate 101 of FIG. 6. A method of manufacturing the OLED 700 using the donor substrate 101 of FIG. 6 is substantially the same as the method of manufacturing the OLED 700 using the donor substrate 100 of FIG. 1. That is, due to the first uneven portion 131a and the second uneven portion 131b included in the donor substrate 101, the transfer layer 140 formed on the encapsulation region 160 and the non-transfer region 150b of the donor substrate 101 may not be transferred to the element substrate 710.

Embodiments of the present invention provide at least one of the following enhancements.

Only a transfer layer disposed on a transfer region can be separated from a donor substrate and transferred to an element substrate. That is, the transfer layer disposed on a non-transfer region and an encapsulation region may not be separated from the donor substrate. In other words, the transfer layer disposed on the non-transfer region and the encapsulation region may not be transferred to the element substrate. Therefore, it is possible to prevent an "unwanted transfer" phenomenon in which the transfer layer is transferred to a region of the element substrate which corresponds to the non-transfer region and the encapsulation region (that is, a region of the element substrate where an encapsulant is to be formed) and thus forms an organic layer.

Furthermore, it is possible to prevent oxygen or moisture from penetrating into an OLED and reducing the efficiency and the life of the OLED. That is, encapsulation defects of the OLED can be prevented or reduced.

However, the effects of the present invention are not restricted to the one set forth herein. The above and other effects of the present invention will become more apparent to one of ordinary skill in the art to which the present invention pertains by referencing the claims and equivalents thereof.

While the present invention has been particularly shown and described with reference to some example embodiments thereof, it will be understood by those of ordinary skill in the art that various changes in form and details may be made therein without departing from the spirit and scope of the present invention as defined by the following claims, and equivalents thereof. It is therefore desired that the present embodiments be considered in all respects as illustrative and not restrictive, reference being made to the appended claims, and equivalents thereof, rather than the foregoing description to indicate the scope of the invention.

What is claimed is:

1. A method of manufacturing an organic light-emitting display device, the method comprising:
   providing an element substrate to comprise a first electrode and a pixel defining layer exposing a plurality of regions of the first electrode;
   laminating a donor substrate and the element substrate such that a transfer layer of the donor substrate faces the first electrode of the element substrate; and
   forming an organic layer by transferring the transfer layer onto the first electrode of the element substrate by irradiating laser beams to an element region of the donor substrate,
   wherein the donor substrate comprises:
   a base layer comprising the element region and an encapsulation region surrounding the element region;
   a transfer assist layer on the base layer and comprising a first uneven portion on the encapsulation region; and
   a transfer layer on the transfer assist layer,
   wherein the first uneven portion is formed on a surface of the transfer assist layer contacting the transfer layer.

2. The method of claim 1, wherein the first uneven portion is formed by plasma treatment.

3. The method of claim 1, wherein the transfer layer formed on the encapsulation region is not transferred to the element substrate.

4. The method of claim 1, wherein the element region comprises one or more transfer regions and a non-transfer region surrounding the one or more transfer regions, the transfer assist layer comprises a second uneven portion on the non-transfer region, the second uneven portion is formed on the surface of the transfer assist layer contacting the transfer layer, and the forming of the organic layer comprises irradiating laser beams to the one or more transfer regions of the donor substrate.

5. The method of claim 4, wherein the second uneven portion is formed by plasma treatment.

6. The method of claim 4, wherein the transfer layer formed on the encapsulation region and the non-transfer region is not transferred to the element substrate.

\* \* \* \* \*